United States Patent

Elabd

[11] Patent Number: 5,818,052
[45] Date of Patent: Oct. 6, 1998

[54] LOW LIGHT LEVEL SOLID STATE IMAGE SENSOR

[75] Inventor: Hammam Elabd, Sunnyvale, Calif.

[73] Assignee: Loral Fairchild Corp., Syosset, N.Y.

[21] Appl. No.: 634,636

[22] Filed: Apr. 18, 1996

[51] Int. Cl.[6] .................................................. G01T 1/18
[52] U.S. Cl. .............................. 250/370.09; 250/370.06; 357/72; 357/428; 357/444
[58] Field of Search ............................... 257/292, 42, 72, 257/451, 441, 444, 440, 428, 429; 250/370.09, 370.06

[56] References Cited

U.S. PATENT DOCUMENTS

| 4,395,736 | 7/1983 | Fraleux | 358/213 |
|---|---|---|---|
| 4,407,010 | 9/1983 | Baji et al. | 358/213 |
| 4,423,325 | 12/1983 | Foss | 250/332 |
| 4,589,003 | 5/1986 | Yamada et al. | 357/22 |
| 4,638,343 | 1/1987 | Elabd et al. | 257/451 |
| 4,651,001 | 3/1987 | Harada et al. | 250/330 |
| 4,714,950 | 12/1987 | Kawajiri et al. | 357/30 |
| 4,939,369 | 7/1990 | Elabd | 250/332 |
| 4,942,474 | 7/1990 | Akimoto et al. | 358/213.11 |
| 4,980,546 | 12/1990 | Berger | 250/208.1 |
| 5,101,255 | 3/1992 | Ishioka et al. | 357/30 |
| 5,122,881 | 6/1992 | Nishizawa et al. | 358/212 |
| 5,140,162 | 8/1992 | Stettner | 250/370.09 |
| 5,196,702 | 3/1993 | Tsuji et al. | 250/327.2 |
| 5,198,673 | 3/1993 | Rougeot et al. | 250/370.11 |
| 5,216,510 | 6/1993 | Amingual et al. | 358/213.15 |
| 5,220,170 | 6/1993 | Cox et al. | 250/370.09 |
| 5,245,201 | 9/1993 | Kozuka et al. | 257/53 |
| 5,352,897 | 10/1994 | Horikawa et al. | 250/370.06 |
| 5,399,882 | 3/1995 | Andoh et al. | 257/42 |
| 5,401,952 | 3/1995 | Sugawa | 250/208.1 |
| 5,481,124 | 1/1996 | Kozuka et al. | 257/185 |
| 5,483,071 | 1/1996 | Oikawa et al. | 250/370.09 |

FOREIGN PATENT DOCUMENTS

| 52-63090 | 5/1977 | Japan | 257/42 |
|---|---|---|---|
| 63-6864 | 1/1988 | Japan | |
| 1-13768 | 1/1989 | Japan | 257/444 |
| 1-235262 | 9/1989 | Japan | |
| 2-213165 | 8/1990 | Japan | |

OTHER PUBLICATIONS

"Development Of The Super–HARP Camera, A Rival To the Human Eye, for the Next Generation of Broadcasting", by Janichi Yamazaki et al, pp. 322–324.

"A ¼ Inch Format 250K Pixel Amplified MOS Image Sensor Using CMOS Process" H. Kawashima et al., 4 pages.

"New Low Noise Output Amplifier For High Definition CCD Image Sensor" N Mutoh et al. NEC Corporation, pp. 7.5.1 –7.5.4.

"Optimization of CCD Output Amplifier For SN Ratio Improvement" T. Nakano et al., IEEE Workshop, 5 pages.

"1–inch high–performance HDTV HARP Camera Tube", T. Yamagishi et al., Conf. on Photoelextronic Image Devices, Lodnon, Sep., 1991.

*Primary Examiner*—Jerome Jackson
*Attorney, Agent, or Firm*—Perman & Green, LLP

[57] ABSTRACT

A broad band solid state image sensor responsive to up to and beyond 1 μm cutoff wavelength for use in a camera capable of imaging under very low light level conditions with good modulation transfer efficiency resulting in high resolution. The high sensitivity at low light level is achieved by an image sensor combination of a photoconductor with high avalanche detection gain, a silicon detector with very high gain pixel level amplifiers and noise suppression circuits. A high gain avalanche rushing photoconductor (HARP) sensor device is connected to an amplified metal-oxide silicon (AMOS) device and a low-noise read-out device. The high sensitivity image sensor is fabricated by depositing an amorphous Selenium photoconductive layer on the top of a Silicon junction diode or a Palladium Silicide, (Pd2Si) Schottky barrier diode that is connected to the AMOS pixel amplifier circuits to form two story circuit.

13 Claims, 9 Drawing Sheets

LOW LIGHT LEVEL SOLID STATE IMAGE SENSOR

BACKGROUND OF THE INVENTION

1. Field of the Invention

The present invention relates to optical and x-ray (imaging) sensing systems, and more particularly to an optical system including a low light level imaging sensor.

2. Description of Background Art

Current 12-TV technology is characterized by modulation transfer function loss in the 12 tube and the fiber optic, face plate coupling to the change-coupled-device (CCD) sensor. The state of the art is to use 1000×2000 element CCD array behind a 25 mm intensifier tube to image at low light levels. Available HDTV sensors with 30 frames/sec scan rate are <14 mm on the side (length or height) versus 25 mm 12 tube diameter. Hence expensive fiber optic taper coupling is required. Bright objects or over exposure results in halo around the over exposed area. The intensified TV cameras tends to be larger, heavier and power hungry compared to regular solid state EO cameras. The non intensified solid state sensor device of the present invention eliminates the image intensifier and the fiber optic coupler of the prior art device.

X-ray imaging for radiology and fluoroscopy requires the conversion of x-ray photon to visible light photons for film exposure. This conversion process takes place in scintillation layers that degrade the image resolution and details. The present invention may also be applied to direct conversion of x-ray photons to electrons in the Selenium photoconductor. Followed by readout in the output multiplexer single x-ray photon detection is possible. Alternately the present device can operate behind an optical scintillator and benefits from the avalanche process to improve the sensitivity at low light levels. It may also operate in electron-in mode detecting electrons emitted from a photocathode in an image intensifier.

Publications relating to high gain avalanche rushing photoconductors and low noise pixel amplifier technology are as follows:

1. Junichi Yamazaki, Kenkichi Tanika and Ketichi Shidaru "Development of Super-HARP Camera, a Rival to the Human Eye for the Next Generation Broadcasting", SMPTE Journal, pp. 322, May 1992.
2. H. Kawashima, F. Andoh, N. Murata, K. Tanaka, M. Yamawaki and K. Taketoshi, "A ¼ Inch Format 259K Pixel Amplified MOS Image Sensor Using CMOS Process", IEDM 1993.
3. Yoshiyuku Matsunaga, Hirofumi Yamashita and Shinji Ohsawa "A Highly Sensitive On-Chip Charge Detector for CCD Area Image Sensor", IEEE Journal of Solid State Circuits, Vol. 26, No. 4, April 1991.
4. Edwin Roks, et al. "A Bipolar Floating Base Detector (FBD) for CCD Image Sensors", IEEE 1992, 5.4.1, IEDM Proceedings.
5. N. Mutoh, M. Morimoto, M. Nishimura, N. Teranishi and E. Oda "New Low Noise Output Amplifier for High Definition CCD Image Sensor", IEEE, 1989, 7.5.1, pp. 173.

SUMMARY OF THE INVENTION

This invention provides a solid state image sensor for use in a camera capable of imaging under very low light level conditions with good modulation transfer efficiency resulting in high resolution. The high sensitivity at low light level is achieved by an image sensor combination of a photoconductor with high avalanche detection gain, very high gain pixel level amplifiers and noise suppression circuits. The pixel amplification or photocharge gain is realized with no increase in the noise floor due to the small bandwidth of the signal before multiplexing. The photoconductive avalanche gain process is a low noise process particularly under thermoelectric (TE) cooling conditions. The photodetectors cover both the visible near infra red and short wave infra red spectrum to utilize all the night sky photons.

The broad band detectors are formed by utilizing the spectral band of amorphous selenium a-Se, UV-to-red and the spectral band of the silicon UV to NIR. Alternatively the broad band detector is formed by utilizing the spectral band of Palladium Silicide on Silicon Schottky Barrier detector ($Pd_2Si$—Si) which covers UV-to-SWIR with a cut off wavelength around 3 $\mu$m.

Other and further features, advantages and benefits of the invention will become apparent in the following description taken in conjunction with the following drawings. It is to be understood that the foregoing general description and the following detailed description are exemplary and explanatory but are not to be restrictive of the invention. The accompanying drawings which are incorporated in and constitute a part of this invention and, together with the description, serve to explain the principles of the invention in general terms. Like numerals refer to like parts throughout the disclosure.

DESCRIPTION OF THE PREFERRED EMBODIMENTS

The non-intensified low light level imaging sensor device of the present invention is capable of higher resolution format size, over exposure control, lower size, weight, power and cost compared to presently available devices.

The non intensified low light level imaging device can be used in producing uncooled night vision imagery or real time X-ray imaging and display such as during surgery or just simply for continuous observation and analysis of some body function in man or animal i.e. both radiology and fluoroscopy. The device can generate images at very low signal levels, at high modulation transfer function and hence very low X-ray dose to the patient. The result is to allow long continuous internal observation of body function even outside the radiologist's office/clinic.

Other applications of the image sensor of the present invention are helicopter pilotage, security systems, traffic and electronic news gathering/broadcast.

HARP-AMOS image intensifier tubes with photocathodes that respond to a wide spectral range of photons allows imaging at low light level because it takes advantage of all night sky lights.

The photo cathodes emit electrons in response to visible light. These electrons are then accelerated by 2 KV voltage in the image intensifier before they strike on the a-Se layer of the HARP-AMOS device placed inside the vacuum of the image intensifier. This "electron-in" mode of the HARP-AMOS is beneficial because the electrons are absorbed in the first 200 Å° of the Se and excite photo generated holes that are multiplied by the avalanche gain and readout by the AMOS readout. The HARP-AMOS device has more radiation tolerance than CCDs, has greater tolerance to bright source overloads. CCDs if used in this application, then need to be thinned to 4 μm thickness and back side illuminated. This is usually not manufacturable and results in large dark current levels.

Figure 1:
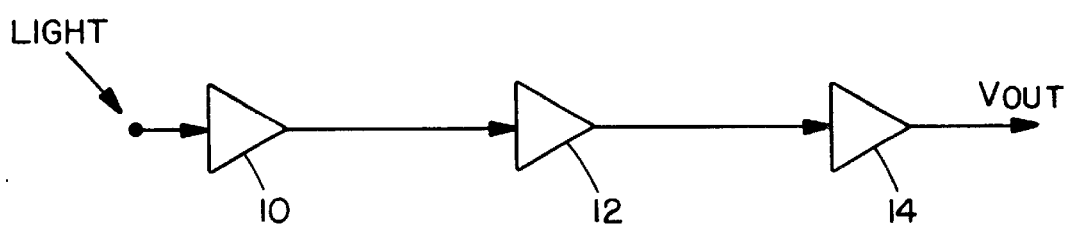
FIG. 1 is a schematic block diagram of a non-intensified low light level high gain avalanche rushing photoconductive layer (HARP) amplified MOS (AMOS) solid state image sensor.

Referring to FIG. 1, a schematic illustration of an embodiment of the present invention is shown including a high gain avalanche rushing photoconductor (HARP) sensor device 10 connected to an amplified metal-oxide silicon (AMOS) device 12 and a low-noise read-out device 14. This high sensitivity image sensor is fabricated by depositing an amorphous Selenium (a-Se) photoconductive layer with $10^{12}$ Ohm-Cm resistivity on the top of a Silicon junction diode or a Palladium Silicide, (Pd2Si) Schottky barrier diode that is connected to the pixel amplifier circuits to form two story circuit. The spectral response of the two story imaging sensor is the composite of the spectral response of the photoconductive process in the over-layer and that of the photodetection process in the underlying Silicon or the Schottky diode. The image sensor device contains low voltage drive electronics and a high voltage supply to bias the photoconductive layer into the high electric field regime required to induce avalanche multiplication. The low light level image sensor device of the present invention also contains interlock or protection circuits required to prevent the interface nodes between the low voltage and high voltage circuits from charging to voltage levels that will cause damage to the integrated circuits. In addition, the low light level image sensor device (camera) contains the digital signal processing circuits required to realize a low light level imaging algorithm that performs a spatial real time filtering designed to improve signal-to-noise ratio (SNR) by adding fractions of signal from neighboring pixels to the output signal of the current pixel. The weighing factors are designed to enhance SNR. For example, by sacrificing resolution in favor of larger sensitivity at the very low end of the illumination scale. The algorithm is also capable of doubling the integration time (skip reset) and use external frame to frame differencing to reduce lag effects.

More particularly, HARP device 10 and AMOS device 12 provide a monolithic or hybrid focal plane array based on an amorphous Selenium (a-Se) film deposited on and connected to an amplified MOS readout circuit of the Si or Pd2Si detector structure.

The deposited overlayer of avalanching Selenium forms a high gain avalanche rushing amorphous photoconductor (HARP) which will provide X10 to X100 gain to the photosignal produced by visible R,G,B light. This is achieved by the multiplication of hole mobile carrier due to the difference in hole and electron ionization coefficients.

$d=3.8\times10^7 e^{1.5\times10^7}/E$ (holes)

$p=17\times10^7 e^{9.3\times10^6}/E$ elections

Cascading one or more AMOS pixel amplifiers such as amplifier 12 with the photosignal from HARP sensor 10 will provide gains of up to X30,000 for the (visible) photosignal and the X30–30,000 for (NIR) photosignal and hence excellent signal to noise ratio. A charge amplification factor of 30 in AMOS pixel amplifiers has been achieved and reported in the literature (Sugawara et al. IEDM-93[2]).

The pixel signal to (temporal) noise ratio of an intensified 12-TV sensor can be approximated by the following equation:

$$SNR=(1/NF)(Ns)^{**}0.5 \qquad (1)$$

where NF is the noise figure (a typical NF is equal to 2) and Ns is the number of electrons/pixel/integration time.

The pixel signal to (temporal) noise ratio for a low light level MOS/CCD sensor is given by:

$$SNR=G^*Ns/(G^*Ns+Nn^{}2)^{}0.5 \qquad (2)$$

where G is the pixel gain and Nn is the MOS/CCD noise floor, in units of rms electrons/pixel/integration time. This includes the various sources of noise such as output node amplifier and dark current notice. Equation (2) also assumes no background signal under low light level conditions. The pixel gain G is equal to unity in typical CCDs. A greater than unity pixel gain G may be achieved by the combination of two processes: avalanche multiplication during the photodetection process in device 10, and amplification of the voltage or current signal in device 12 after the photoconversion using MOS or bipolar circuits. Hence the pixel gain is given by:

$$G=G1^*G2 \qquad (3)$$

The goal of the low light level imaging circuit of the present invention is to achieve the condition G*Ns>>Nn.

The gain of the pixel amplifier 12 or the charge amplification factor (G2) is determined by the voltage gain ($A_v$) of the pixel amplifier 12 and the ratio of the memory capacitance (CM) to detector capacitance (CD), FIG. 3.

$$G2=A_v^*CM/CD \qquad (4)$$

The noise figure of the avalanche gain process is almost unity up to film break down voltage. The pixel gain serves to extend the operating range of the sensor as the photon flux decreases. So it is advantageous to have an adaptive gain control i.e. increase the gain as the photon flux decreases. If the photon flux continues to decrease while the device gain is at the maximum setting, then pixel grouping is applied to increase the signal level while sacrificing the geometric resolution. Charge packet grouping (pixel binning or spatial filtering) will be required for efficient processing for signal levels that are greater than one thousand electrons after amplification.

The white thermal noise fluctuations of a MOSFET amplifier is proportional to the square root of the bandwidth, the input gate capacitance and inversely proportional to the channel transconductance gm. The band width of the pixel amplifier is smaller than the band width of the video amplifier by a factor equal to the number of pixels in the imager. The smaller the band width together with a small gate capacitance and high gm will lead to a smaller white noise. The 1/f noise component in a good Si process is small and the TE cooling helps reduce any additional noise caused by the leakage in the pixel amplifier. The 1/f noise and the KTC reset noise are further reduced by multiple correlated double sampling (CDS) circuits.

Figure 2:
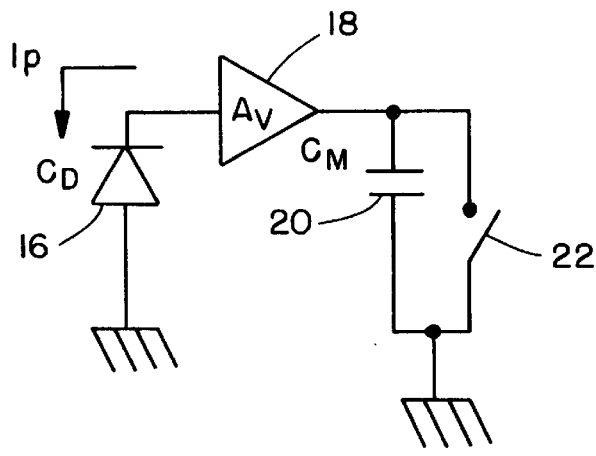
FIGS. 2 and 3A, 3B are schematic block and circuit diagram of a example of a unit cell of an amplified MOS (AMOS) pixel amplifier used in the present invention.

Referring to FIG. 2, a circuit diagram for a single stage of the AMOS device 12 of FIG. 1 is shown. The circuit includes a junction device 16 having a detector capacitance CD, a voltage amplifier 18 and a memory capacitor 20 having a capacitance CM that can be reset by closing switch 22.

Figure 3A:
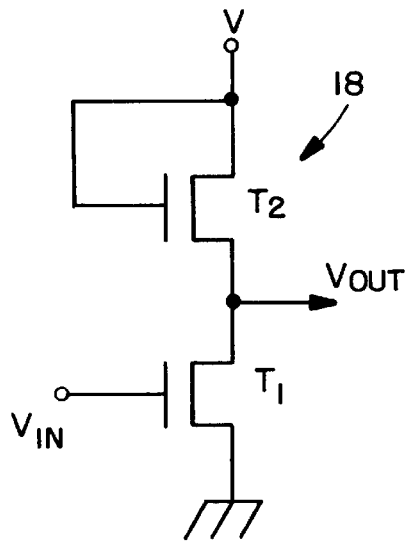
Figure 3B:
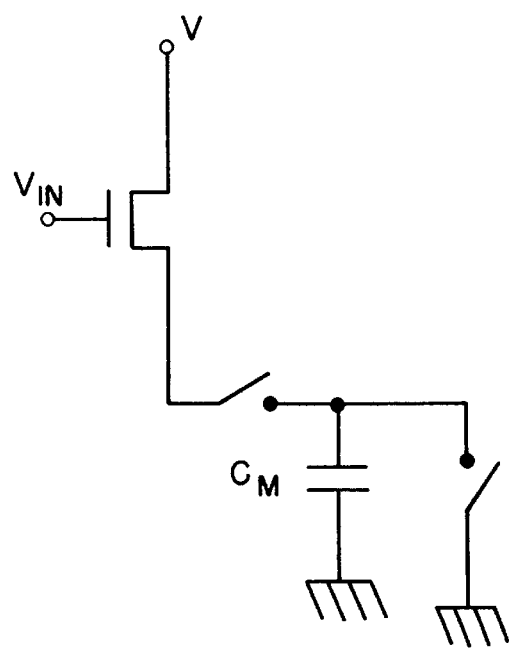

FIGS. 3A and 3B illustrate the common source implementation of the amplifier 18 of the unit cell of the amplified AMOS pixel 12 of FIG. 2 which contains the drive transistor of the enhancement transistor amplifier. FIG. 3A is a more detailed illustration of the embodiment of FIG. 2 showing voltage amplification charging the memory capacitor (CM) 20. FIG. 3B shows a source follower implementation of the amplifier in the unit pixel to charge the memory capacitance. In FIG. 3A, $T_1$ is the drive transistor located in the pixel and $T_2$ is the load transistor located outside the image register area. The voltage gain of an enhancement pair is determined by the W/L ratio of the two transistors. The charge gain can be as high as X100, or more for a single stage device.

The following equations refer to the operation of the circuits of FIGS. 2, 3A and 3B wherein:

$$V_{OUT} = \frac{1}{C_M} \int i_{OUT} dt + \text{CONSTANT}$$

$$V_i = \frac{1}{C_D} \int i_p dt$$

$$i_o = -C_M \frac{dV_o}{dt} = -C_M \frac{dA_V V_i}{dt} = -A_V C_M \frac{dV_i}{dt} = -A_V \frac{C_M}{C_D} i_p$$

$$G_C = \frac{i_{OUT}}{i_p} = A_V \frac{C_M}{C_M}$$

$$A_V = \sqrt{\frac{(W/L)T_1}{(W/L)T_2}}$$

Figure 4:
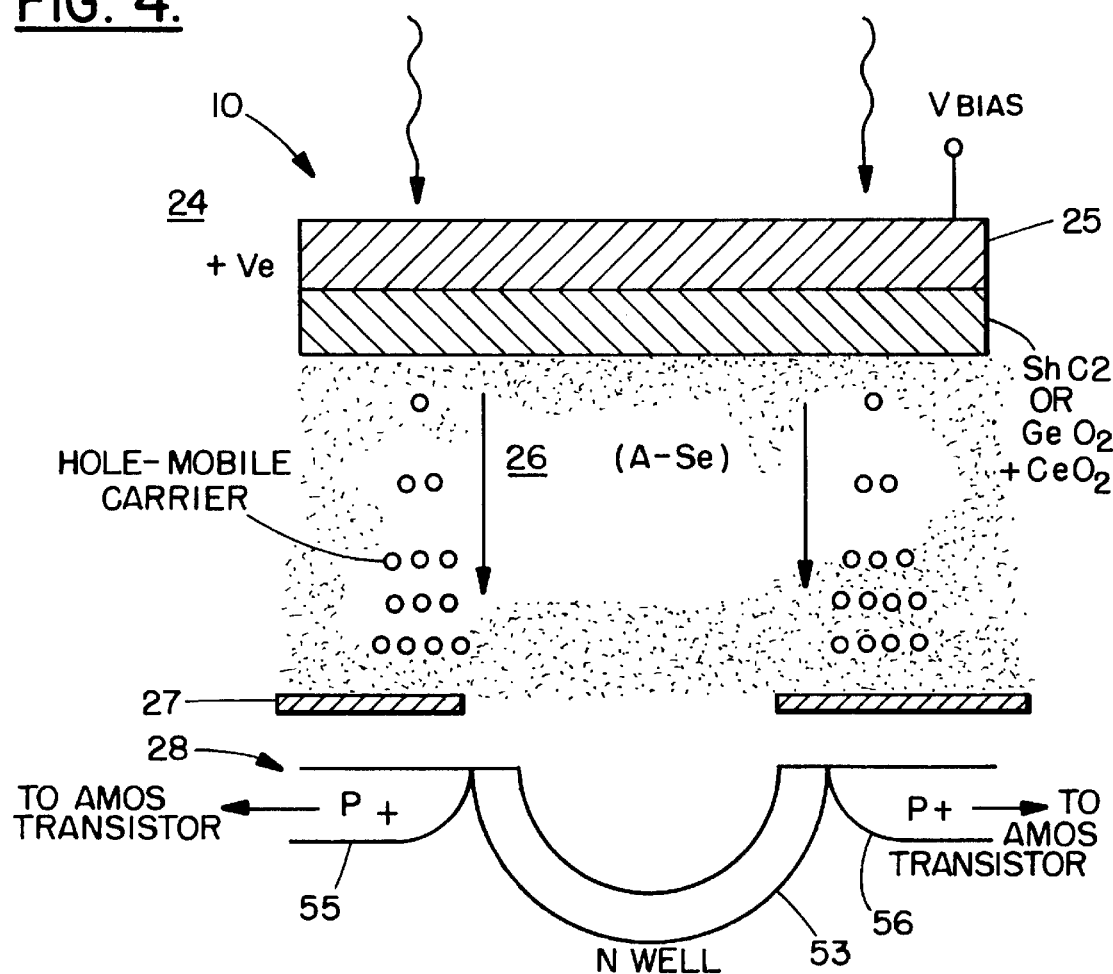
FIG. 4 is a schematic cross-section illustration of an ultra-high sensitivity AMOS-HARP monolithic pixel embodiment according to the principles of the present invention.

$G_C$=charge gain i.e. gain of AMOS amplifier
$A_V$=voltage gain of the first stage AMOS amplifier
$C_D$=detector capacitance
$C_M$=memory capacitance
$i_{out}$=output circuit of the driver ($T_1$) transistor
$i_p$=input photocurrent of the driver ($T_1$) transistor Referring to FIG. 4, a schematic cross-section of the monolithic AMOS-HARP structure of FIG. 1 is illustrated. The photoconductive detector region 24 of the a-Se layer 26 of the AMOS 10 is shown responsive to light.

The target voltage is positive inducing photo excited holes to travel downward to the underlying junction 28. As they travel under the accelerating affect of high electric field, the holes multiply by the avalanche process. If the underlaying P+–N junction 28 was charged negative at the beginning of the integration period, then the hole current will discharge the junction as the photon integration proceeds, the circuit saturates/trips at the ground potential (sublinear integration characteristics) and hence the junction does not charge to a high voltage that would damage the circuit. The photon flux that is transmitted (not absorbed by) the a-Se layer 26 is then absorbed by the underlaying Silicon or PD2Si photodetector, this also serves to discharge the junction capacitance. Hence the spectral response of the HARP-AMOS two story detector is the composite of the Si and a-Se absorption processes. It is also possible to engineer specific physical window regions (holes) in the a-Se layer 26 to allow the photon flux to be absorbed directly by the underlaying Silicon detector. Depositing a Pd2Si detector under the a-Se layer 26 will result in a composite photoresponse that extends up to 1.5 to 3.5 um, i.e. to the short wave infra red spectrum. Hence the detector will collect night sky photons more efficiently.

Figure 5:
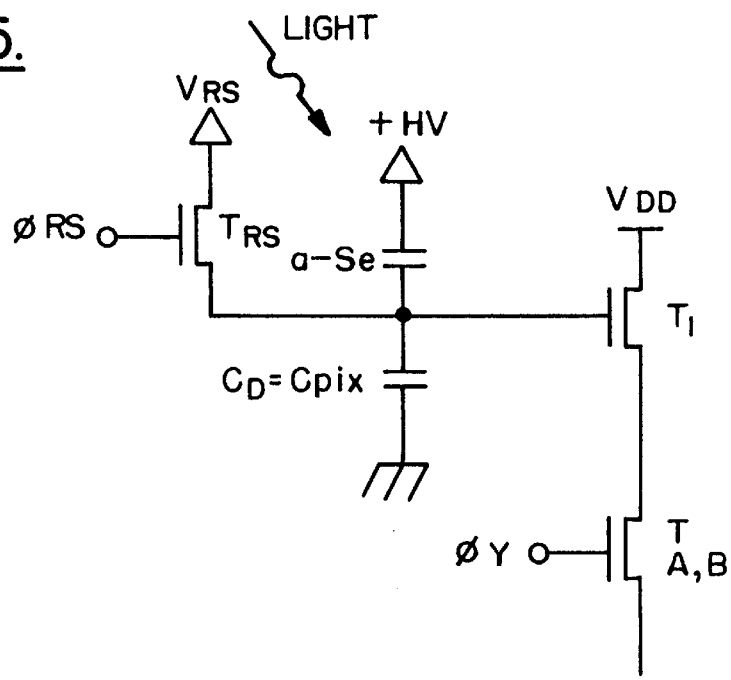
FIG. 5 is a schematic diagram of a basic HARP-AMOS pixel circuit.
Figure 9:
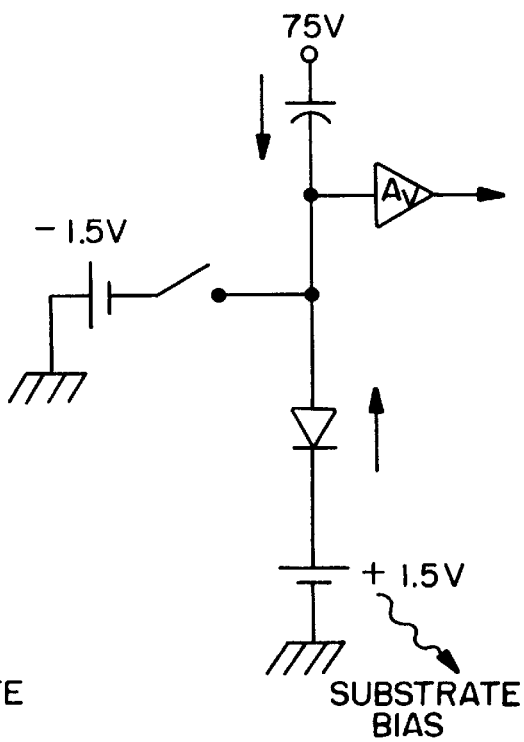

The voltage integrated on the junction capacitance is then amplified, under pixel selection condition, through the single or multi stage pixel amplifier (12 in FIG. 1). One possible embodiment realization of a single stage amplifier for amplifier 12 is shown in FIGS. 3 and 5. In this case the voltage gain of this single stage amplifier charges the larger memory capacitance, CM, with much larger charge packet than was accumulated on the detector junction capacitance CD where CD is the capacitance of the photodiode PD in FIG. 9. In another embodiment the output of this single stage pixel amplifier which is capable of producing a voltage gain equal to 30 and a charge gain of 100, is switched onto a second stage amplifier located below the column or between pixel clusters. This additional stage is then capable to uniformly boost the gain by an additional gain factor of x3 to x30. The detector/junction capacitance is reset every field time to a constant reset voltage.

The sensor array can be cooled by single stage TE cooler to avoid non uniformities caused by dark current generation and amplification. The junction detector below the amorphous Selenium layer shown can be made in the form of a Palladium silicide Schottky barrier detector for extended spectral response, e.g. >1.5 um, and more efficient use of night sky irradiance for night vision. In this case however, three stage TE cooling, instead of one stage TE cooling, may be required to achieve operating temperatures of around 160-K. The pixel amplifier 12 can be implemented with noise figures approaching unity due to the very small band width required at the pixel frame rates.

In FIG. 4, the unique spectral response of the pixel is the result of a combination of the spectral response of amorphous Selenium and Silicon junction. The silicon junction (P+ source and drains 55 and 56 and N Well 53) is either made by N+ diffusion in P-substrate or P+ diffusion in N-well/substrate. The a-Se layer shows high quantum efficiency in the UV, blue and green. It shows moderate Quantum efficiency in the red. No a-Se photosensitivity in the near infrared is documented yet. The underlying Silicon junction will intercept and absorb the near infrared photons that escape through the amorphous Selenium layer. These near infrared photons will be converted to hole-electron pair in silicon to charge the gate capacitance of the pixel amplifier. The indium tin oxide (ITO) layer 25 provides an electrically conductive but optically transparent electrode where light comes in to the structure. The ITO electrode 25 is biased (Vbias) by 75 Volt or higher voltage to induce avalanche electric field in 5000 Å or thicker a-Se film. The $GeO_2$—$CeO_2$ or SnC2 layer is a hole carrier blocking contact layer. The antimony trisulfide layer 27 is an electron carrier blocking contact. The structure shown between the layers 27 provides connection to pixel gates. Layer 50 may be a first metal and may include the reset circuit φ RS, $T_{RS}$ shown in FIG. 5, layer 51 may be a second metal and include the φY, $T_{A,B}$ circuit of FIG. 5 and layer 52 may be a polysilicon electrode and include circuit $T_1$ of FIG. 5. No opaque metal separates the silicon junction detector and the amorphous Selenium detectors to allow near infrared photons from night sky light. The two spectral bands may be imaged separately in sequence through a liquid crystal tuned filter which will either expose NIR or visible band depending on the applied bias. The active amplifier in the pixel is shielded from light by Aluminum layer. The shield also allows state control of the pixel selection transistors without influence of the accelerating field of a-Se. If the two visible and near infrared bands are imaged simultaneously through a wide band spectral filter the detectors should be connected to the pixel amplifier in such a way that the two visible and NIR currents add and do not subtract - see FIGS. 5 and 6.

Figure 6:
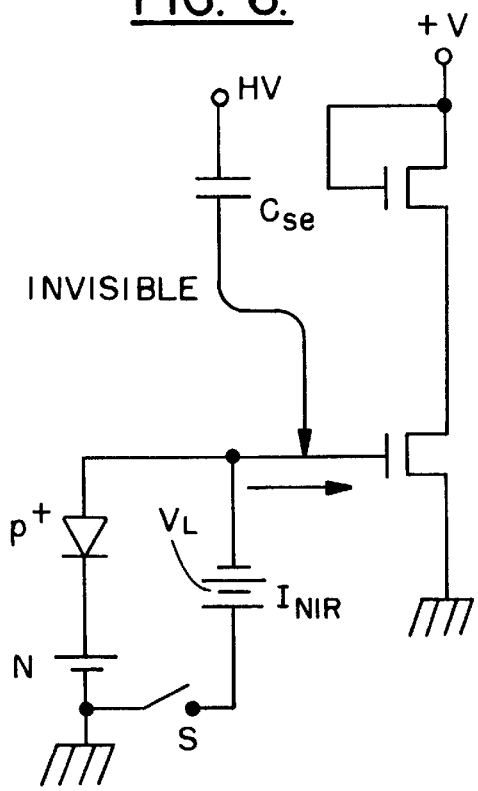
FIGS. 6–18 are schematic illustrations of the multispectral detection (VIS and NIR) and of noise suppression and other circuit details used in explaining the present invention.

FIG. 6 illustrates an additive photo response wherein S is a reset switch and $V_L$ = the reset switch voltage.

Figure 7:
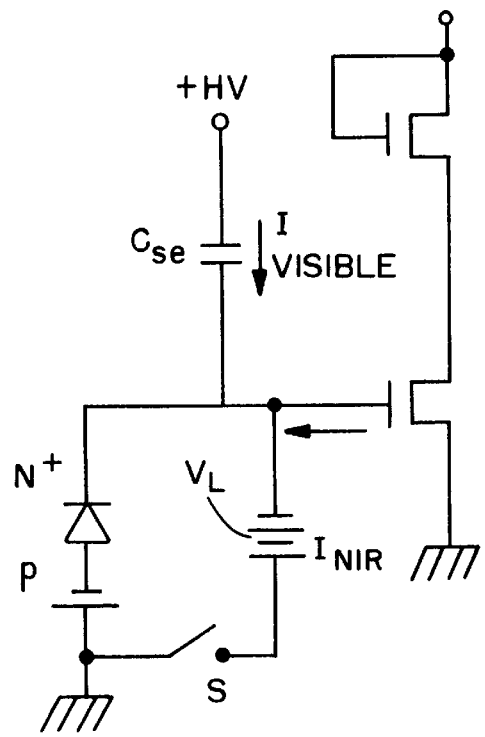
Figure 8:
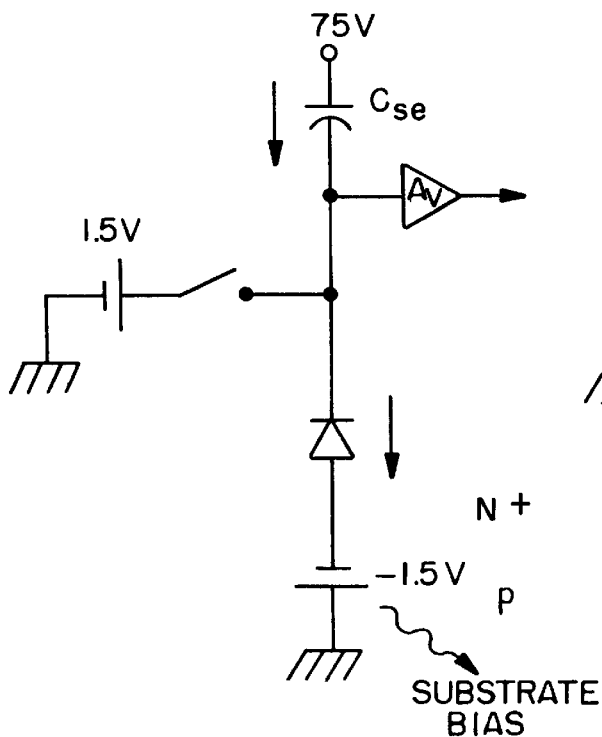

When the circuit FIG. 6 is used the photo response of the silicon detector is in phase with the photoresponse of the a-Se detector. FIG. 7 illustrates an out of phase photo response. In both FIG. 6 and FIG. 7 $I_{visible}$ equals the photocurrent due to visible red, green and blue light. $I_{NIR}$ equals the photocurrent due to near infrared light. The circuit of FIG. 7 can be used with liquid crystal tunable filter (LCTF). The operation would be to electronically set the filter to the visible band and read the response of the a-Se detector (frame #1). Then to set the filter to the NIR band following a reset to read the response of the Si junction detector (frame #2). The reset transistor structure and operating voltage range are different for FIGS. 8 and 9, for different diode polarities.

Figure 10:
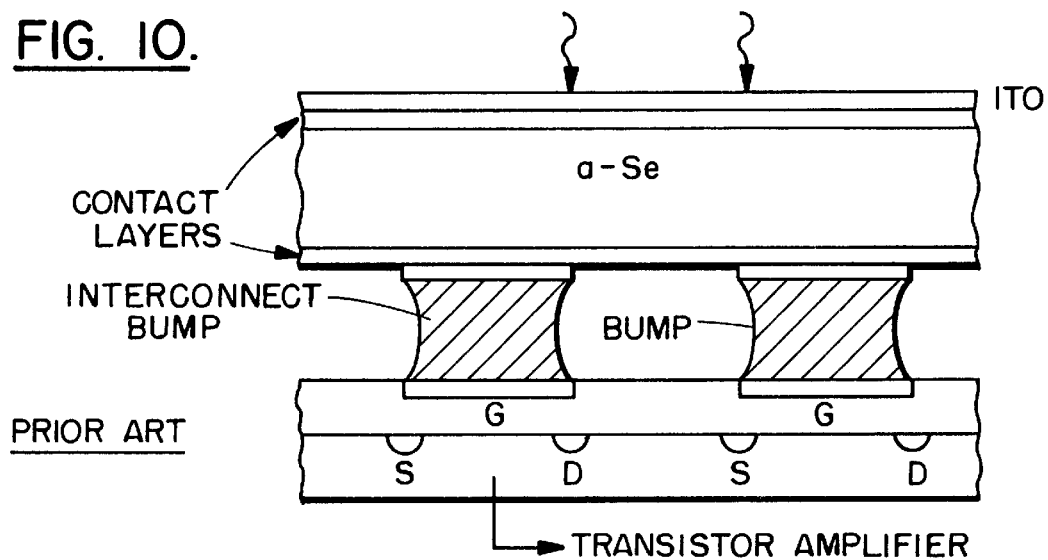

Although FIG. 4 shows the cross section of a monolithic HARP-AMOS detector; it is understood that the patent also covers hybrid HARP-AMOS detectors. In the hybrid case the a-Se film is deposited on glass or sapphire substrate and connected by an indium or PbSn bump to the readout circuit containing the AMOS pixel amplifiers. The advantage of the hybrid approach is that the a-Se film will tend to be more uniform when deposited on the flat surface of the glass/sapphire substrate as compared to the non-flat surface of a silicon integrated circuit. The disadvantage of the hybrid approach is the cost of manufacturing and blemishes caused by manufacturing defects - see FIGS. 10 and 11. FIG. 10 shows a flat a-Se film using hybrid technology with improved flatness over the monolithic HARP-AMOS sensor of the present invention.

Figure 11:
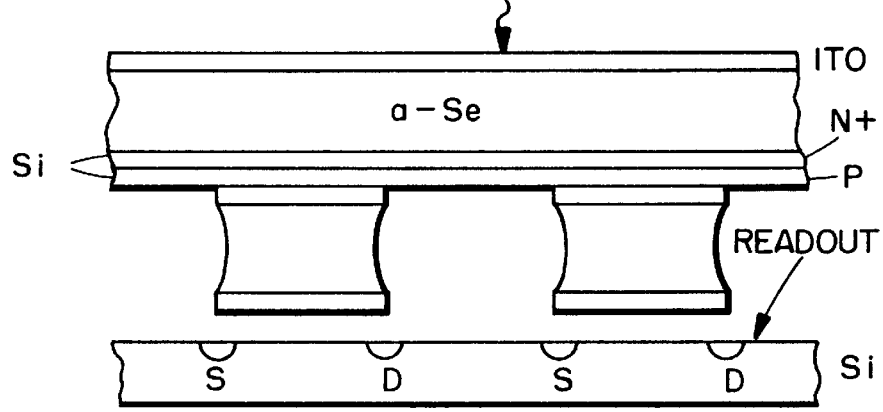

FIG. 11 shows the flat hybrid a-Se and p-N junction detector hybridized to the readout silicon circuit.

Figure 12:
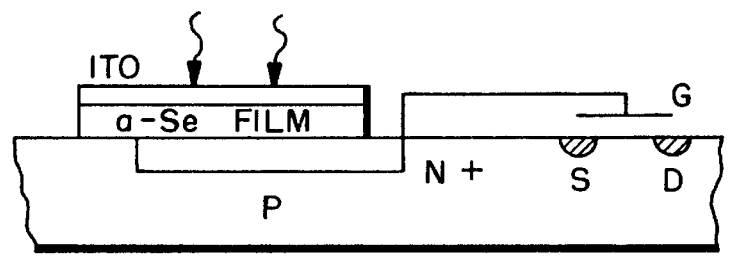
Figure 13:
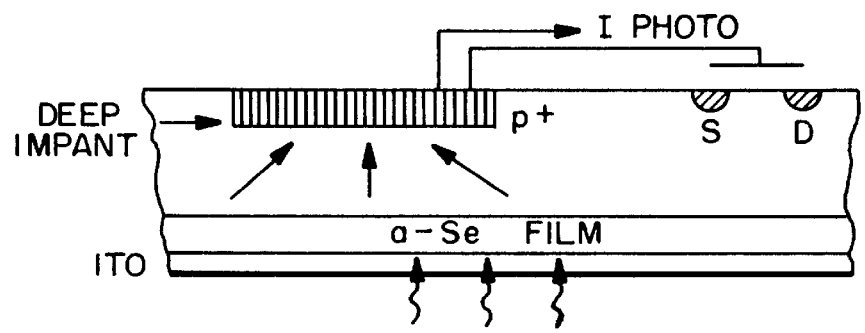
Figure 14:
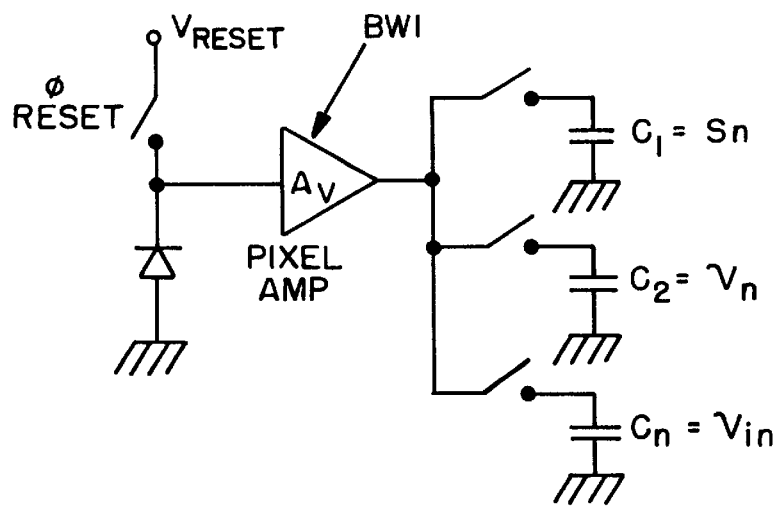

To improve the flatness in HARP-AMOS monolithic structures it is necessary to deposit the a-Se film on a flat region in the silicon substrate, i.e., the junction surface or the back surface of the silicon wafer (FIGS. 12 and 13). FIG. 12 shows an embodiment of a sensor using front illumination and FIG. 13 illustrates an embodiment of a sensor using back illumination. The improved flatness is important because it makes the avalanching electric field uniform in the film and avoid premature breakdown by the applied field. The difference between FIG. 4 and FIG. 10 is that hybrid architecture avoids the application of the a-Se film to non-uniform surface caused by polysilicon electrode processing. Alternately multiple planarization layers and vias are used to flatten the surface of monolithic array before a-Se deposition.

FIGS. 14–18 relate to the noise suppression in the pixel amplifier employing correlated double sampling using a differential amplifier (i.e. an operational amplifier).

Temporal noise suppression is implemented by correlated double sampling method on each pixel amplifier and each column or output amplifier.

The temporal noise components are:
(1) 1/f noise in the first stage pixel amplifier (driver transistor).
(2) Thermal noise in the channel of the driver transistor.
(3) Reset noise of the pixel node capacitance which includes the junction capacitance in parallel with the capacitance of the photo-conductive layer and the gate capacitance of the driver transistor.
(4) Dark current and signal shot noise generated in the photoconductive layer and the Silicon detector/junction area.

The temporal noise reduction circuit is in the form of low level correlated double sampling, low pass filtering and difference amplifier (on or off chip).

Figure 15:
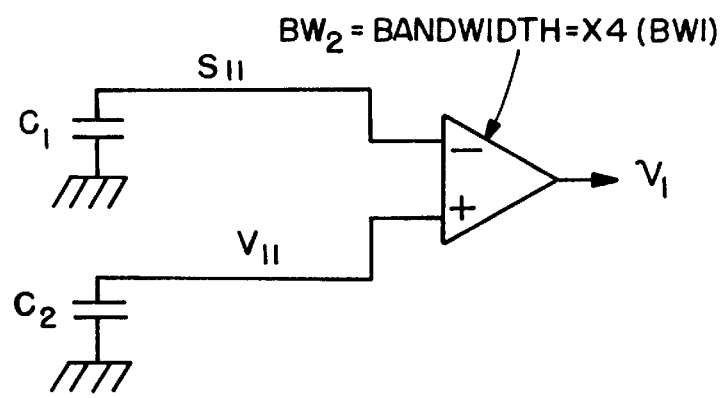
Figure 16:
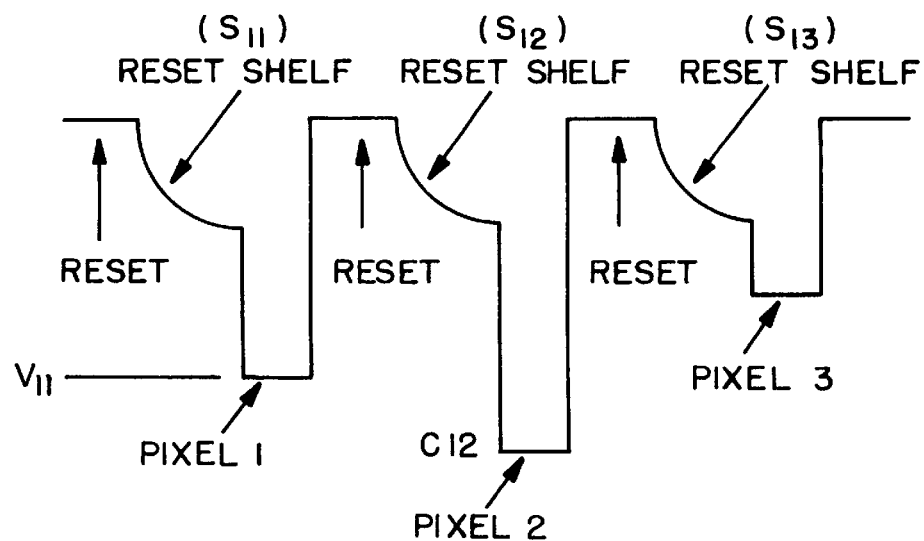

It is designed to achieve sub 1 electron noise floor reflected to input signal level by removing completely the 1/f and KTC (reset noise) components. Also by restricting the bandwidth of the thermal white noise. The correlated double sampling circuit for on chip (pixel amplifier) noise suppression is done in one of two ways. In FIG. 15, by using difference signal to feed an amplifier and in FIG. 17 using an LC delay line technique. Various measures are adopted to lower the shot noise component in the noise floor. This includes thermo-electric cooling, use of epitaxial Silicon wafers, optimization of the epilayer thickness as well as using high temperature hydrogen anneal to passivate dangling bonds at the Si—$SiO_2$ interface.

Figures 17, 18:
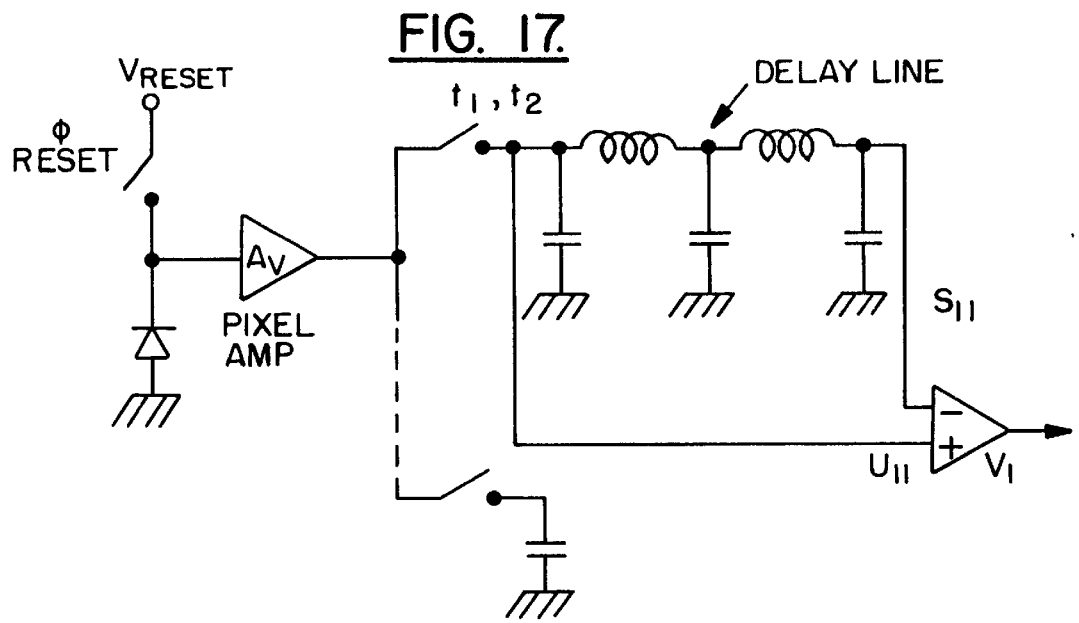

Thermal noise reduction is achieved by optimizing the W:L ratio of the driver transistor, maximizing the transconductance and minimizing the bandwidth to approx X3.5 the data (sampling) rate. The spatial noise (fixed pattern noise) is the result of differences in threshold voltages of the transistors in the pixels. This fixed pattern noise is corrected using an external or on chip digital differencing circuit as shown in FIG. 18 using 2 point correction algorithm. This corrects for offset and gain difference effects between different pixel amplifiers. In addition the inputs of each CDs stage are shorted while the output is sampled to remove CDs offset signals after the photosignal is measured.

In FIG. 18, memory B contains video frame data at zero illumination (off chip) and memory A contains video frame data at 50% to 85% illumination level (off chip) . An arithmetic logic unit and a multiplier are used to correct for gain and offset errors in the image.

The temporal and spatial noise components before and after noise reduction are estimated in the following table.

|  | Before Correction | After Correction Referred to Input |
|---|---|---|
| Reset noise | 60 electrons | 0.5 electrons |
| 1/f noise | 24 electrons | 0.3 electrons |
| thermal noise | 16 electrons | 0.1 electrons |
| dark signal shot noise | 16 electrons | 0.16 electrons |
| spatial noise | 2% | 0.05% |

Alternatively, a statistical correlated double sampling circuit can be implemented that utilize multiple temporal sample of the detector voltage before a reset clock is applied. A regression model for least square fit is then used to calculate the correct video value less the offset or intercept of the extrapolated signal.

The image sensor device is additionally equipped with high voltage interlocking circuit that slowly ramps up and down the target high voltage after the camera using this image sensor is turned on. This is done to avoid damaging the sensor under surge signal/switching conditions.

Figure 19:
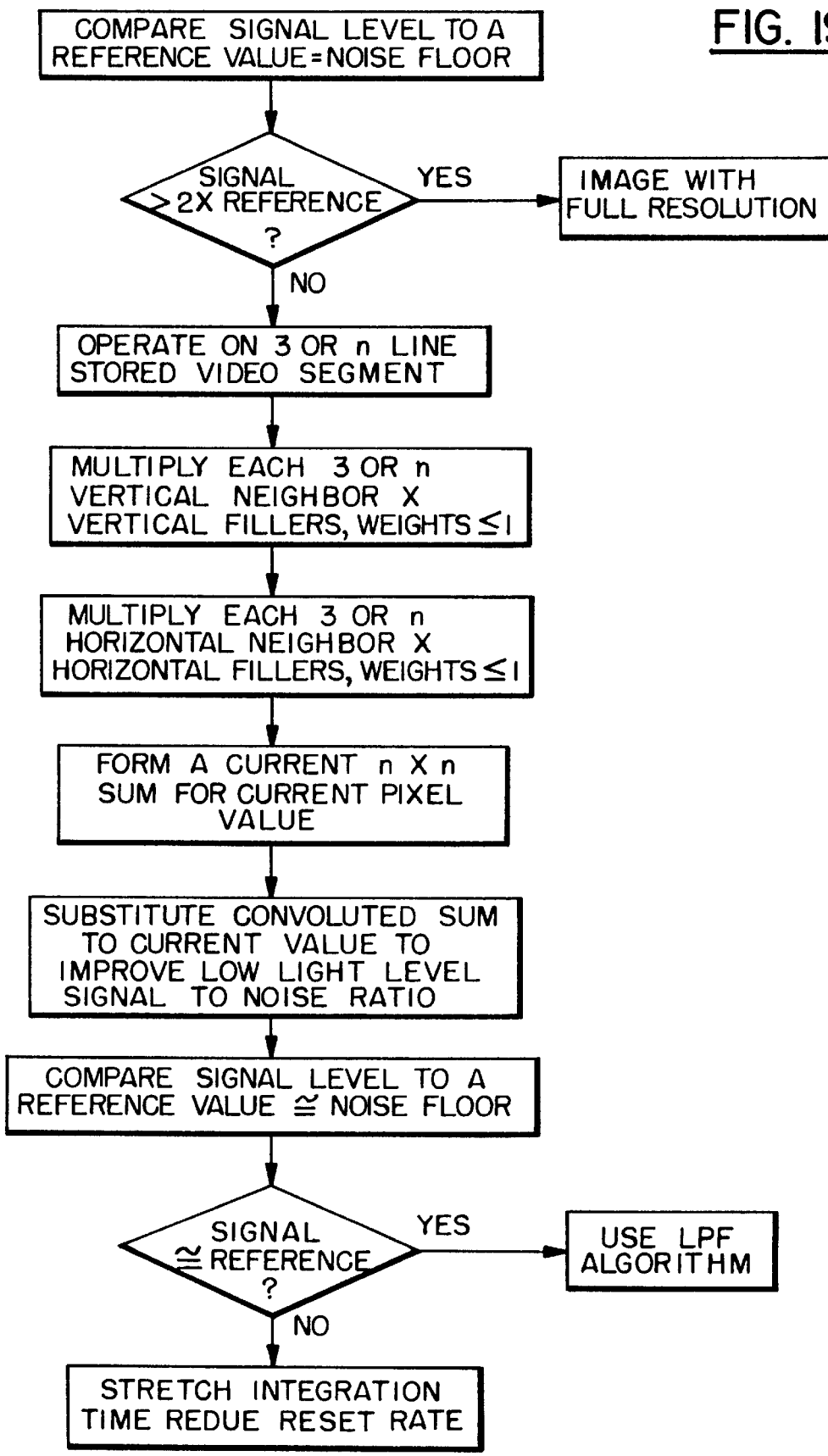
FIG. 19 is a flow diagram used in explaining the low pass filter algorithm used with the present invention.
Figure 20:
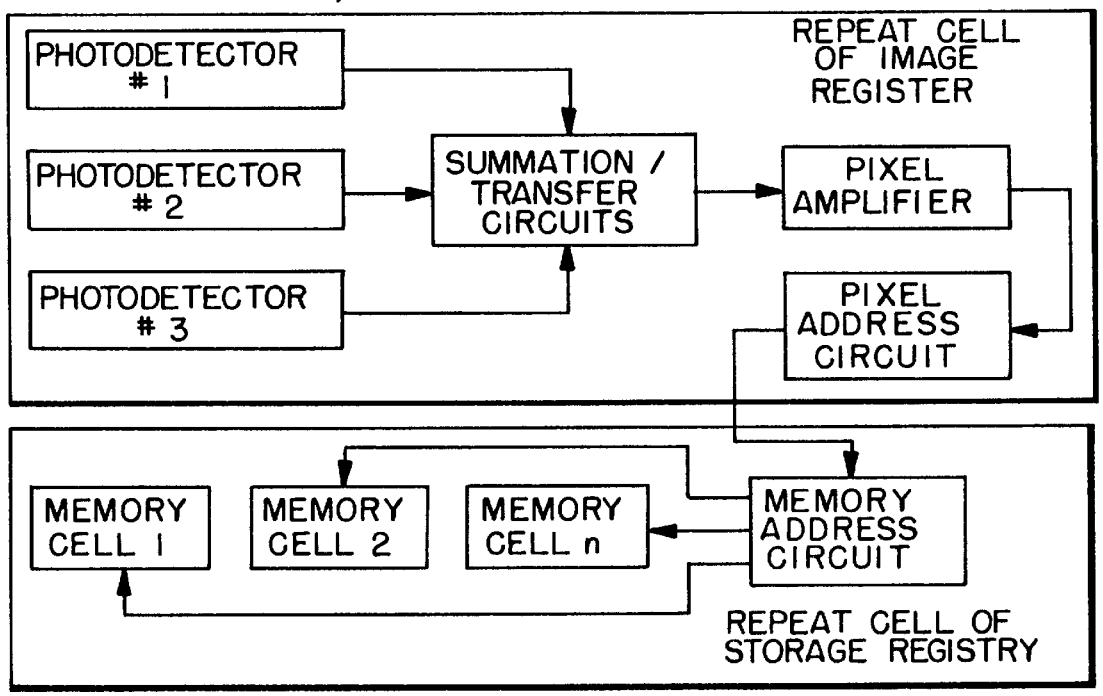
FIG. 20 a schematic illustration of the parallel pixel and memory cells used in the present invention.

An imaging algorithm for low light level imaging, as illustrated in FIG. 19 can be easily mapped into the hardware/firmware of the sensor and the camera. FIG. 20 shows a pixel cluster composed of three pixels and a corresponding memory cluster composed of n memory capacitors or cells. The imaging algorithm can process multiple video samples simultaneously using a weight kernel. This signal processing circuits required to realize a low light level imaging algorithm that performs spatial real time filtering algorithm designed to improve signal to noise ration (SNR) by adding fractions of the signal from neighboring pixels to the output signal of the current pixel. The weight factors are designed to enhance SNR. The algorithm is also capable of doubling the integration time (skip reset) and use external frame to frame differencing to reduce lag effects. This algorithm may be implemented partially or fully in this sensor because of the design/architecture than processes several pixels in a cluster or lines in parallel during line readout (FIG. 20).

Referring to FIG. 19 and 20, under normal operating conditions this LLL (low light level) solid state image sensor will operate with full resolution, i.e., photo detector 1 may be sampled once or twice per frame (before and after reset occurs) and the samples are stored in memory cell 1 and memory cell 2. The difference between the samples before and after reset represent the video signal of the detector. An alternative is not to worry about the difference and assume that the voltage before reset is the correct value of the video. If the total gain $G=G_1 \times G_2=1000$, for example $G_1=10$ and $G_2=100$. Then for every photon absorbed 1000 electrons are generated. To achieve very low light level operation (photon counting), the noise floor must be reduced below the photon shot noise level.

For example, if it is needed to image a scene with a signal level of 10 photons then the corresponding electrical signal after gain of 1000 is 10000 electrons. The photon shot noise corresponding to the 10 photon signal is $\sqrt{10}=3.16 \approx 3$ photons. This corresponds to an electrical signal equaling 3000 electrons. The overall HARP-AMOS noise floor including all sources of noise must be much less than 3000 electrons to be photon shot noise limited in imaging 10 photon signal. In reality, the dominant noise contribution to the noise floor of HARP-AMOS is the residual fixed pattern noise after 2 point correction. The avalanche excess noise process may be 32 times (30 db) below signal noise. It is possible to build an AMOS readout circuit with less than 1000 electron noise floor (referred to the input signal level). Hence this low noise HARP-AMOS sensor built with a chip noise suppression pixel level CDs will be able to detect one photon signal but at that level the SNR $\cong 1$. To improve the target recognition at low light level at a noise rich environment corresponding to one or two photons (or fraction photon/frame/pixel), it is important to apply further noise suppression and spatial filtering algorithm. The noise suppression algorithm takes advantage of multiple signal samples within a frame stored in memory cells 1 . . . n before reset to achieve a better estimate of the signal and the photon presence that utilizes less on chip/off chip circuits is to add the charge of neighboring detectors before reading them out and storing them in the memory cells. So it is essentially determined that below 1000 or 2000 electrons a low pass filter operation is conducted to represent each pixel by its value and the addition of its surrounding 3×3 pixel vales.

With vertical filter only, the output of the summation/ transfer circuits is $v_0=w_1 v_1 + w_2 v_2 + w_3 v_3$ where $w_1, w_2$ and $w_3$ are the weights of the vertical spatial filter.

In case of both vertical and horizontal kernal, the filter coefficients equal that resulting from the multiplication of vertical and horizontal filters=VF*HF $$v_o = \begin{bmatrix} w_{11} & w_{12} & w_{13} \\ w_{21} & w_{22} & w_{23} \\ w_{31} & w_{32} & w_{33} \end{bmatrix} \begin{bmatrix} v_{11} & v_{12} & v_{13} \\ v_{21} & v_{22} & v_{23} \\ v_{31} & v_{32} & v_{33} \end{bmatrix}$$

around each pixel in the image. Since it is difficult to implement the weight kernel with weights other than 1 (unity) in the summation transfer block, then additional memory cells are used to store the unconvoluted image of 3 or 5 lines and then operate with the horizontal and vertical kernels on the stored segment of the image memory cell 1 . . . n.

Figure 21:
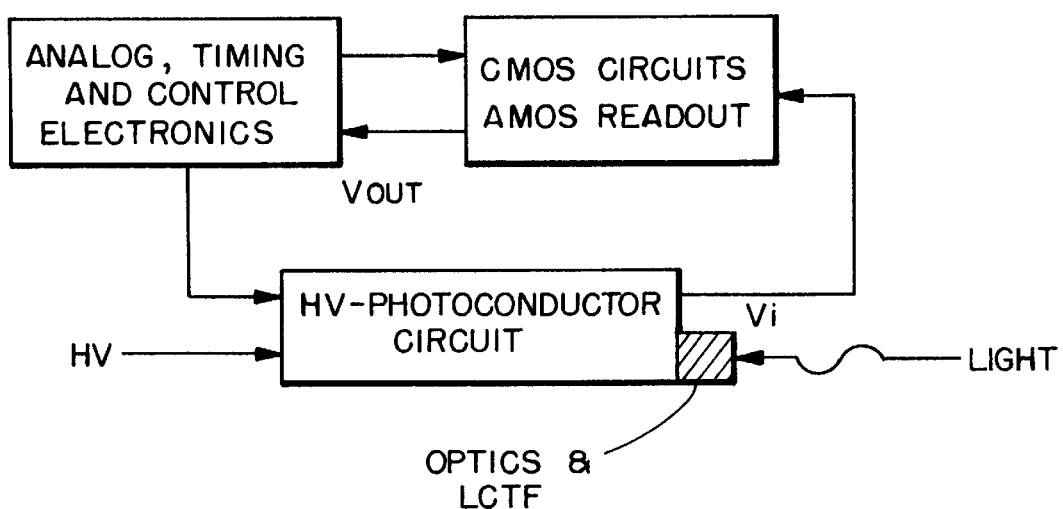
FIGS. 21 and 22 show a block diagram and circuit diagram of a more complete representation of a HARP-AMOS detector circuit.
Figure 22:
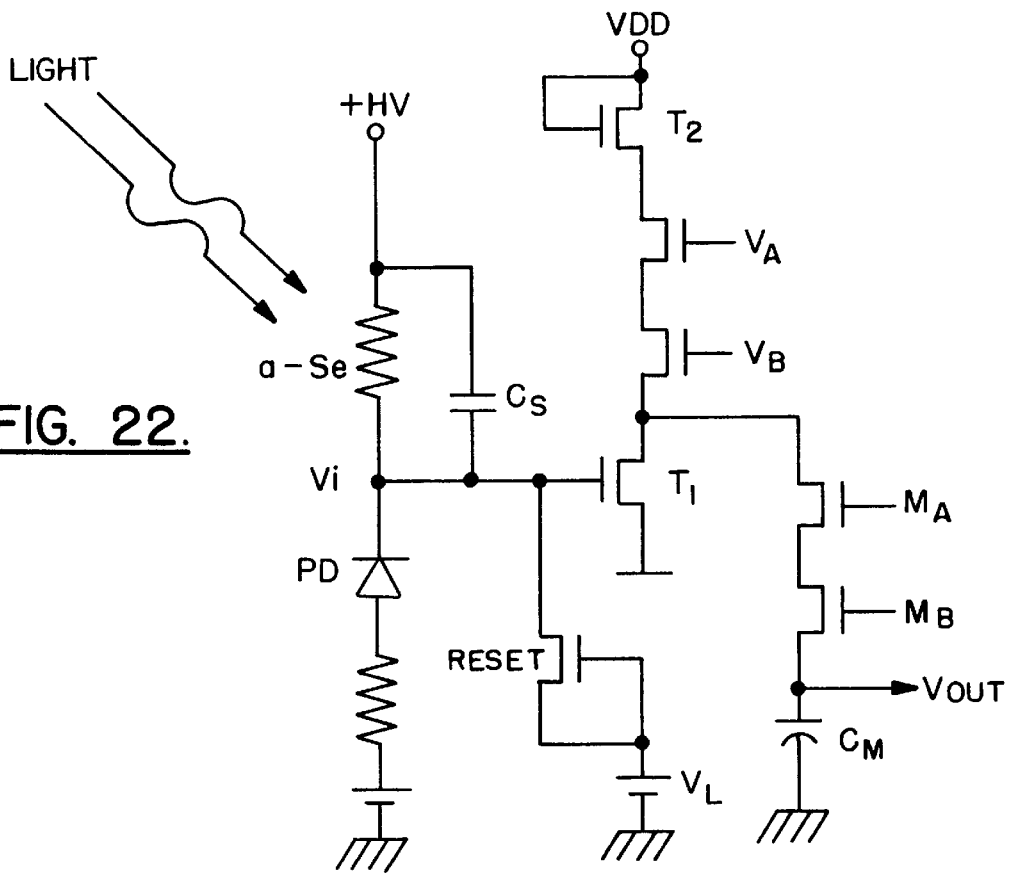

FIGS. 21 and 22 show a more complete representation of the HARP-AMOS detector circuit. In principle FIG. 21 shows a block diagram of the HARP-AMOS camera; which contains the timing electronics, the off chip analog signal processing, the high voltage (75 volt or higher) bias voltage for the a-Se layer, the amplified MOS readout shows the optics and the liquid crystal tuned filter.

FIG. 22 shows the silicon function photodiode in series with the amorphous Selenium layer a-Se with, $C_s$ equivalent capacitance. The a-Se layer may be followed by either a hole blocking contact or a dielectric layer and a HV bias (transparent) electrode. The layer capacitance is reset by either a reset pulse applied to the transistor or long optical stimulus applied to the back surface of the a-Se layer to neutralize trapped charge. $T_1$ is the driver stage of the pixel amplifier and $T_2$ is the load stage of the pixel amplifier. Transistors VA and VB represent the image register select transistors. Transistors MA and MB represent the memory cell select transistors which are used to select the specific memory capacitance CM used to store the voltage sample of the pixel amplifier. The reset transistor and the supply voltage VC is used to reset the pixel node capacitance and diode before starting the integration period.

Figure 23:
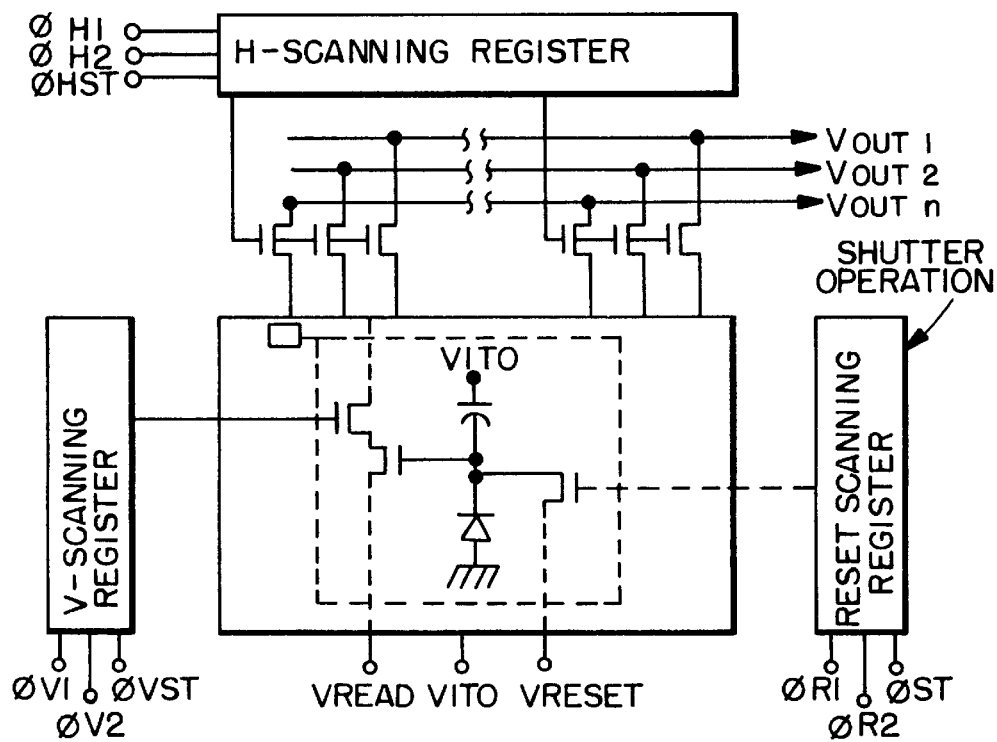
FIG. 23 is a schematic block diagram of a high speed HARP-AMOS sensor array including horizontal and vertical scanning register circuits used in the present invention.

FIG. 23 shows a matrix imager of HARP-AMOS detectors. The matrix driven by horizontal and vertical scanning registers (H and V scanning registers) which are used to select and readout the individual pixels to 3 separate and parallel outputs ($V_{out}$ 1, 2, 3). The reset signal/clock is controlled by the reset scanning register. The reset clocks are used to reset both the detectors of the image register and the storage capacitors of the memory registers.

What has been described is a solid state image sensing system for use in a camera capable of imaging under very low radiation level conditions with good efficiency and resolution.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

I claim:

1. A broad band solid state image sensing system for sensing very low level visible and near infrared image radiation up to and beyond 1 $\mu$m wavelength for producing output signals representative of said image radiation comprising:

a high gain avalanche amorphous photoconductive means responsive to visible input image radiation for generating output signals in response to said visible input image radiation and a solid state MIS or a diode detector responsive to near infrared input image radiation for producing output signals in response to said near infrared input image radiation;

a high gain pixel level current, voltage charge amplification means including at least one pixel amplifier connected to said photoconductive means for amplifying said output signals from said photoconductive means, said pixel level amplification means including a junction device means, a detector junction capacitance CD, at least one memory capacitor CM for storing voltage gain, and a reset means for resetting said memory capacitor CM, and a dark signal temporal noise suppression circuit means connected to said high gain pixel level amplification means and responsive to said amplified signal therefrom for providing an output signal with suppressed noise components, said temporal noise suppression means including a differential amplifier for providing correlated double sampling between black level signal and light level signal.

2. A solid state image sensing system according to claim 1 wherein said solid state MIS or diode detector includes at least one silicon junction capacitor or Si MIS capacitor, and wherein high gain pixel level amplification means include a layer containing at least one amplified metal-oxide silicon (AMOS) amplifier circuit connected to at least one junction diode or multiplexed between several silicon junction diodes.

3. A solid state image sensing system according to claim 2 wherein said photoconductive means is a high gain avalanche photoconductive (HARP) diode composed of an amorphous Selenium (a-Se) photoconductive layer and a solid state diode detector layer disposed on said amplified metal-oxide silicon (AMOS) layer to extend the spectral response of said image sensing system up to 1 $\mu$m, or beyond.

4. A solid state image sensing system according to claim 3 wherein said amplified metal-oxide silicon (AMOS) layer contains a plurality of amplified metal-oxide silicon (AMOS) amplifier circuits connected to each other and each connected to one or more silicon junction detectors wherein said output signals from said photoconductive means and said solid state diode detector means are combined in phase or out of phase and said pixel level amplification means includes a plurality of memory capacitors CM that are reset singly or in combination.

5. A solid state image sensing system according to claim 3 wherein said solid state diode layer is a silicon junction diode.

6. A solid state image sensing system according to claim 3 wherein said solid state diode layer is a Palladium Silicide Schottky barrier junction for extending the cutoff wavelength of said image sensing system up to 2.5–3.0 $\mu$m range.

7. A solid state image sensing system according to claim 5 wherein said silicon junction diode is formed by N+diffusion in a P substrate.

8. A solid state image sensing system according to claim 5 wherein said silicon junction diode is formed by p+diffusion on N-well/substrate.

9. A solid state image sensing system according to claim 3 wherein said solid state detector is a Metal Oxide Silicon (MOS) detector.

10. A solid state image sensing system according to claim 3 wherein said photoconductive means further includes a hole blocking contact layer disposed on said amorphous Selenium layer and a radiation responsive biased transparent electrode disposed on said hole blocking contact layer, and an electron blocking contact layer disposed between said amorphous Selenium layer and said solid state diode layer.

11. A solid state image sensing system according to claim 3 wherein said solid state image sensing system is a hybrid structure wherein said amorphous Selenium layer is deposited on a flat, inert substrate and connected via bumps of conductive material to said amplified metal-oxide silicon (AMOS) layer.

12. A solid state image sensing system according to claim 3 wherein said noise suppression circuit includes means for suppressing variable temporal noise and fixed pattern spatial noise.

13. A solid state image sensing system according to claim 3 wherein said sensing system includes a plurality of amplified metal-oxide silicon (AMOS) amplifier circuits connected to each other, and wherein said noise suppression means includes signal processing circuit means for performing a spatial real time filtering function for improving signal-to-noise ratio of said (AMOS) amplifier circuits to the output signal of each (AMOS) amplifier circuit.

* * * * *